(12) United States Patent
Tai et al.

(10) Patent No.: US 7,299,444 B1
(45) Date of Patent: Nov. 20, 2007

(54) INTERFACE FOR PIN SWAP INFORMATION

(75) Inventors: Jan-Sian Tai, San Francisco, CA (US); King Ou, Fremont, CA (US)

(73) Assignee: Altera Corporation, San Jose, CA (US)

( * ) Notice: Subject to any disclaimer, the term of this patent is extended or adjusted under 35 U.S.C. 154(b) by 39 days.

(21) Appl. No.: 11/095,949

(22) Filed: Mar. 31, 2005

(51) Int. Cl.
*G06F 17/50* (2006.01)

(52) U.S. Cl. .......................................... 716/16; 716/17

(58) Field of Classification Search ............... 716/8, 716/9, 16–17
See application file for complete search history.

(56) References Cited

U.S. PATENT DOCUMENTS

| | | | | |
|---|---|---|---|---|
| 5,068,603 | A * | 11/1991 | Mahoney | 714/726 |
| 5,519,630 | A * | 5/1996 | Nishiyama et al. | 716/17 |
| 6,473,885 | B1 * | 10/2002 | Wallace | 716/4 |
| 6,477,611 | B1 * | 11/2002 | Chang | 710/313 |
| 6,539,536 | B1 * | 3/2003 | Singh et al. | 716/18 |
| 6,629,308 | B1 * | 9/2003 | Baxter | 716/16 |
| 6,877,040 | B1 * | 4/2005 | Nam et al. | 709/238 |
| 6,901,562 | B2 * | 5/2005 | Cooke et al. | 716/1 |
| 2001/0034593 | A1 * | 10/2001 | Cooke et al. | 703/14 |
| 2003/0080777 | A1 * | 5/2003 | Baxter | 326/39 |
| 2003/0084418 | A1 * | 5/2003 | Regan | 716/14 |
| 2004/0139413 | A1 * | 7/2004 | DeHon et al. | 716/9 |
| 2005/0071787 | A1 * | 3/2005 | Koga et al. | 716/1 |
| 2005/0114817 | A1 * | 5/2005 | Wallace | 716/10 |
| 2006/0033527 | A1 * | 2/2006 | Lee et al. | 326/41 |
| 2006/0117280 | A1 * | 6/2006 | Wallace | 716/4 |
| 2006/0156142 | A1 * | 7/2006 | Gabrielson et al. | 714/742 |

* cited by examiner

*Primary Examiner*—Paul Dinh
*Assistant Examiner*—Suchin Parihar
(74) *Attorney, Agent, or Firm*—Beyer Weaver LLP (57) ABSTRACT

An electronic board design includes a programmable logic device (PLD) and involves optimizing the routing of traces to the pins of the device. A graphic utility of an electronic design automation tool presents an image of the device to a board designer showing physical pin locations and I/O element names. The designer selects a pin to swap by highlighting it. The software applies rule sets and algorithms supplied by the device manufacturer to determine with which other pin of the device the selected pin may be swapped. Results indicate those pins that are compatible, those pins that would be a risky swap, and those swaps that are not allowed. The software highlights in the graphic utility the results by changing the color of the various pins that may or may not be swapped. The board designer can perform the swap and recompile immediately. Input to the software and output from the software can be textual instead of graphical.

25 Claims, 5 Drawing Sheets

INTERFACE FOR PIN SWAP INFORMATION

TECHNICAL FIELD

The present invention relates generally to design tools used for designing a printed circuit board. More specifically, the present invention relates to placing and routing a programmable logic device on such a board.

BACKGROUND

In the field of electronics various electronic design automation (EDA) tools are useful for automating the process by which integrated circuits, multi-chip modules, boards, etc., are designed and manufactured. In particular, electronic design automation tools are useful in the design of standard integrated circuits, custom integrated circuits (e.g., ASICs, ASSPs), and in the design of custom configurations for programmable integrated circuits. Integrated circuits that may be programmable by a customer to produce a custom design for that customer include programmable logic devices (PLDs). Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

Once a design is generated for a PLD and the PLD is programmed a printed circuit board (PCB) designer places and routes the PLD on the printed circuit board or in the system for which it is intended. During the course of placing and routing an FPGA (or any PLD) on a printed circuit board the board designer attempts to simplify the routing on the board as much as possible in order to use fewer layers. For example, a complex routing on a board might require six or more layers, while a less complex routing might only need three. Fewer layers in a printed circuit board is desirable as it lessens the complexity, reduces problems associated with multiple layers and reduces the cost of the printed circuit board.

FPGAs (as well as many PLDs) provide a flexible capability of configuring the input/output elements (I/O elements) of the device based upon the capabilities of the chip and the designer's needs. Thus, in order to simplify the routing of a printed circuit board, and to reduce the number of layers needed, a board designer takes advantage of the configurability of the I/O elements of an FPGA in the course of placing and routing such a device on a board. In other words, to minimize the board routing layers, the board designer might need to change the pin locations of an FPGA design. But, due to the complexity of FPGAs, the board designer must adhere to certain operating rules and conditions specified by the FPGA vendor that are not always intuitive.

Currently, the design of a printed circuit board layout involving an FPGA is very much a trial and error process. Pin swap information (which tells the board designer which pins can be swapped successfully) is manually accumulated by the designer by referencing data sheets and application notes that describe the operating specifications for the I/O elements. These are often paper documents that require manual review by the designer before a pin swap can be confidently performed. An illegal pin swap ends up wasting time because a compilation must be performed, an error message generated, and then the design must be redone correctly. The problem is compounded for highly complex FPGAs in that there will likely be different designers for the FPGA and for the printed circuit board.

Further, should a board designer require a change in the I/O element configuration of an FPGA implementation the FPGA designer must then redesign the FPGA and resubmit his or her design to the board designer. The board designer then attempts to work with the new design and may require even more iterations of this back-and-forth process. It can take hours or days of the engineers' time to work out a suitable FPGA design for a particular printed circuit board.

Accordingly, there is a need to be able to provide a printed circuit board designer with accurate pin swap information for an FPGA in an automated fashion such that he or she can more easily integrate the FPGA onto a printed circuit board.

SUMMARY

To achieve the foregoing, and in accordance with the purpose of the present invention, a method and interface is disclosed that provides pin swap information to a printed circuit board designer.

In the past, printed circuit board designers had to manually search for information regarding which pins of an FPGA could be swapped with other pins. This information was spread out over various printed documents and was often difficult to understand. The present invention incorporates a software feature of an electronic design automation (EDA) tool that provides a graphical user interface to the designer that includes easy-to-understand pin swap information. The interface simplifies the process of making pin swap decisions, which helps the board designer to make more intelligent decisions about the board design and to make these decisions more quickly. The invention also increases the designer's productivity and decreases production costs of the circuit board (by helping to minimize the number of signal layers in the board). Alternatively, the pin swap information is accessible through a script and text reports.

In some situations, the time-consuming iterative process by which a board designer communicates changes to an FPGA designer who then redesigns the chip can be reduced dramatically and automated so that the board designer can make their own valid pin swap decisions.

Advantageously, because the chip-specific and package-specific information is efficiently presented up front to the designer via an interface, the designer does not need to manually look through data sheets and application notes to find the necessary information for making a legal pin swap. Using the information provided in the interface the designer can determine which I/O elements can be swapped with another either individually or in groups.

BRIEF DESCRIPTION OF THE DRAWINGS

The invention, together with further advantages thereof, may best be understood by reference to the following description taken in conjunction with the accompanying drawings in which.

DETAILED DESCRIPTION

The below description describes an exemplary embodiment using a field programmable gate array (FPGA). As is known in the art, an FPGA is a gate array where the logic network can be programmed into the device after its manufacture. An FPGA typically includes an array of logic elements (either gates or lookup table RAMs), flip-flops and programmable interconnect wiring. Most FPGAs are reprogrammable, since their logic functions and interconnects are defined by RAM cells. Examples include the LCA device from Xilinx, Inc., the FLEX family of devices from Altera Corporation, and the ORCA devices from AT&T. Other FPGAs can only be programmed once (by closing antifuses) and retain their programming permanently. FPGAs from Actel are examples of such devices. Other FPGAs (such as those from Atmel) have characteristics of both types of devices. In addition to ordinary logic applications, FPGAs enable the development of logic emulators and can be used as computing devices, among many other uses.

Although use of FPGAs is described herein, and the invention is especially suited for their use, the invention is widely applicable to other devices. The invention is also suitable for use with application-specific integrated circuits (ASICs) and with application-specific standard products (ASSPs). In the case of ASICs and ASSPs a chip designer has the capability to move I/O elements during the design of such a chip before its manufacture. The present invention is also suitable in other situations where a chip designer has the ability to move I/O elements before they are permanently dedicated to a particular physical pin. Accordingly, as used herein in the context of the present invention, the term "programmable logic device" (PLD) refers not only to those programmable logic devices described in the background section, but also to ASICs, ASSPs and to any device where a designer has the ability to move I/O elements to different pins.

As is known in the art, an FPGA may be embodied in a wire-bonded package, in a flip-chip package or other. Typically, each input/output element of the FPGA is associated with a metal pad and with an external physical contact on the package, which is a pin in the case of a wire-bonded package, and which is a solder ball in the case of a flip-chip package. The below description uses the term "pin" or "pin name" to refer to that external physical connection on the chip package. For example, pins of flip chips are often labeled "A1," "A2," etc. The internal signal of the FPGA that is routed to the input/output element is often referred to as an "I/O element," "I/O name," or "signal."

Overview of FPGA and Printed Circuit Board Design Process

In addressing the problem in the prior art noted above, it is realized that current FPGA design software tools (such as an EDA tool) do understand and have information regarding the pin assignment rules. For example, these software tools have information regarding the pin direction (e.g., input, output or bi-directional), voltage level, I/O standard, etc. These tools have typically provided such information about I/O element configurations through graphical interfaces, scripts and compilation report files. But, these prior tools only provided information about the characterization of the I/Os and included very little (if any) information about how these I/Os can be swapped.

In order to facilitate the board design process it is realized that these tools can pass the pin swap information they hold directly to a printed circuit board designer, thus providing accurate pin swap information to the designer in a rapid fashion. Previously, information and rules regarding pins and I/O elements were used at different times during a compilation and were not readily accessible by user. The present invention includes an easy-to-use graphical interface that provides the pin swap information, or includes a command line interface to access the pin swap information, or both.

Figure 1:
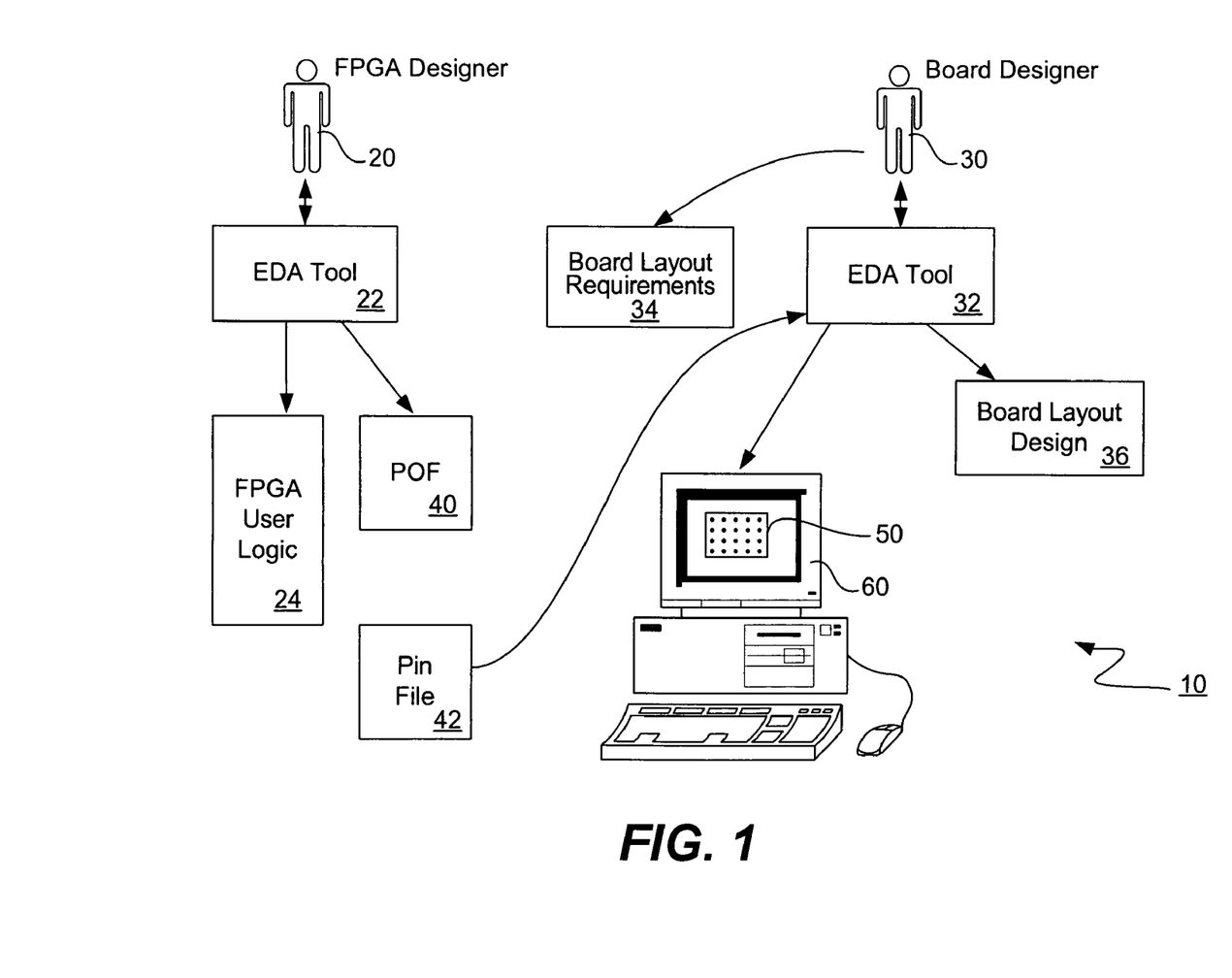
FIG. 1 illustrates an environment in which an FPGA is designed and in which a circuit board is designed.

FIG. 1 illustrates an environment 10 in which an FPGA is designed and in which a circuit board is designed. An FPGA designer 20 uses a computer running an electronic design automation (EDA) tool 22 to create user logic 24 for an FPGA. Any of a wide variety of EDA tools may be used with the present invention. In one embodiment, EDA tool 22 is the Quartus II design software available from Altera Corporation of San Jose, Calif. The user logic 24 may be in any desirable intermediate format by which an engineer creates and later modifies an electronic design for an FPGA. By way of example, user logic 24 may be in Verilog or VHDL format or a schematic capture format, and the configuration or assignments for user logic 24 may have been set through a tool command language or may be a list of constraints generated by the engineer via a user interface of the EDA tool 22 or another EDA tool. Preferably, at this point generation of user logic 24 does not involve compilation as board level constraints need to be considered by the engineer before the design is finalized and compiled.

As will be appreciated by one of skill in the art, creation of an electronic design is very often an iterative process by which an engineer creates a certain level of design, tests it, debugs it and further refines it. Although it is possible for an engineer to create an electronic design without iteration, typically a top-level design is created first and then further refined based upon input from a board designer, other chip designers or a variety of other input. In this example the FPGA designer creates a top-level design and then receives constraints from the board designer before refining the FPGA design. By way of example, a top-level design need not be a complete design for an FPGA but may at a minimum include the logical names of the input and output pins, and would ideally have definition of the I/O assignments such as the voltage and logic characteristics. In particular what is needed at a minimum is the placement of the I/O elements on the FPGA.

A printed circuit board designer 30 will use an EDA tool 32 to eventually create a board layout design 36 that incorporates the FPGA designed by the FPGA designer. EDA tool 32 may be the same as EDA tool 22 or may be different. Preferably, EDA tool 32 is also the Quartus II design software. Alternatively, EDA tool 32 is a schematic capture tool that is used for PCB design; it has the logical mapping of the FPGA package and interfaces to the board layout design 36.

Previous to, concurrently with, or after the design of user logic 24, a printed circuit board designer 30 creates preliminary board layout requirements 34 for the printed circuit board that will contain the FPGA. Typically, these preliminary requirements are generated by the board designer and communicated to the FPGA designer before design of the FPGA begins.

As is known in the art, board designer 30 analyzes all of the chips, devices and components that will be placed onto a printed circuit board in order to create board layout requirements 34. In order to create the board layout requirements, a board designer may take into account the types of devices present on the board, the input and output delays of the various I/O elements, the printed circuit board size, the number of layers desirable, any cost constraints, etc. In one embodiment, the layout requirements are informal, high-level requirements that also include I/O requirements for the FPGA to be placed onto the board (i.e., placement requirements for the FPGA). For example, the I/O requirements for the FPGA might indicate physically on the board where various I/O elements of the FPGA should be placed in order to optimize the printed circuit board design. These requirements may be very specific, e.g., a particular I/O element must be connected to a particular pin, or may be more general, e.g., certain I/O elements must be placed on the upper left side of the FPGA.

These board layout requirements are then transmitted in some fashion to the FPGA designer 20 for incorporation into his or her design using EDA tool 22. These requirements may be in a variety of formats. For example, they may be in an HTML report file, a spreadsheet, a computer document or in a printout of a visual schematic. They may also be transmitted to the FPGA designer in a more informal way such as in an e-mail message or orally. For example, the board designer might discuss the design with the FPGA designer and ask him or her to "put all of the memory interface for the FPGA on its top edge."

Once the FPGA designer has created user logic 24 (including constraints applicable to the FPGA) and has received constraints from the board designer in the form of the board layout requirements 34, the FPGA designer may redesign the FPGA, perform a compilation and output the programming output file (POF) 40 along with a pin file 42. As is known in the art, a POF 40 is a binary file that is used to program a programmable logic device such as an FPGA. Compilation of such an electronic design is known to those of skill in the art and may use any of a wide variety of compilation or incremental compilation techniques. Of course, this whole process may take many other forms, for example the FPGA designer may have completed a design before receiving board level constraints from the board designer and may then need to redo his or her electronic design. Or, the board level constraints might be received by the FPGA designer at the very beginning of the process in which those constraints may be integrated into the original electronic design of the FPGA.

A pin file 42 is a file including pin information and pin assignments for the FPGA (the logical and physical mappings of the pins). While some I/O elements might not have any constraints during the design of the FPGA (or might have only some general constraints, e.g., "place in upper left corner"), the EDA tool would normally assign these I/O elements to particular pins on the FPGA in order to create a valid, working design. Because this pin file contains information about the I/O elements and their assigned pins, it is valuable information for the board designer and hence the pin file is communicated electronically to the board designer's EDA tool 32 for use in the present invention. Through use of the pin file, the board designer is better able to determine which pins of an FPGA may be swapped, and can thus more easily and quickly adjust the design of the board.

Based on the information it has received and on the rules and constraints applicable to the FPGA under design, EDA tool 32 at this point is also capable of outputting to a computer 60 an image 50 showing the contacts of the particular FPGA under design. In this example, shown is the underside of a flip-chip package and its solder ball contacts; of course, image 50 may also show the pins of a wire-bonded package or of any other type of packaged semiconductor device. The EDA tool uses any suitable graphic utility for presenting the graphical user interface shown on computer 60. As will be explained in more detail below, board designer 30 may now use the graphical user interface and image 50 to rapidly obtain valid pin swap information for the FPGA to be placed onto the printed circuit board.

In an alternative embodiment, at this point in time EDA tool 22 is also arranged to accept typed commands from the board designer in order to rapidly provide valid pin swap information, instead of accepting input from the board designer via a graphical user interface. Any command language interface, such as a tool command language may be used. These embodiments will be explained in greater detail below.

Debugging of Board Design

Figure 2:
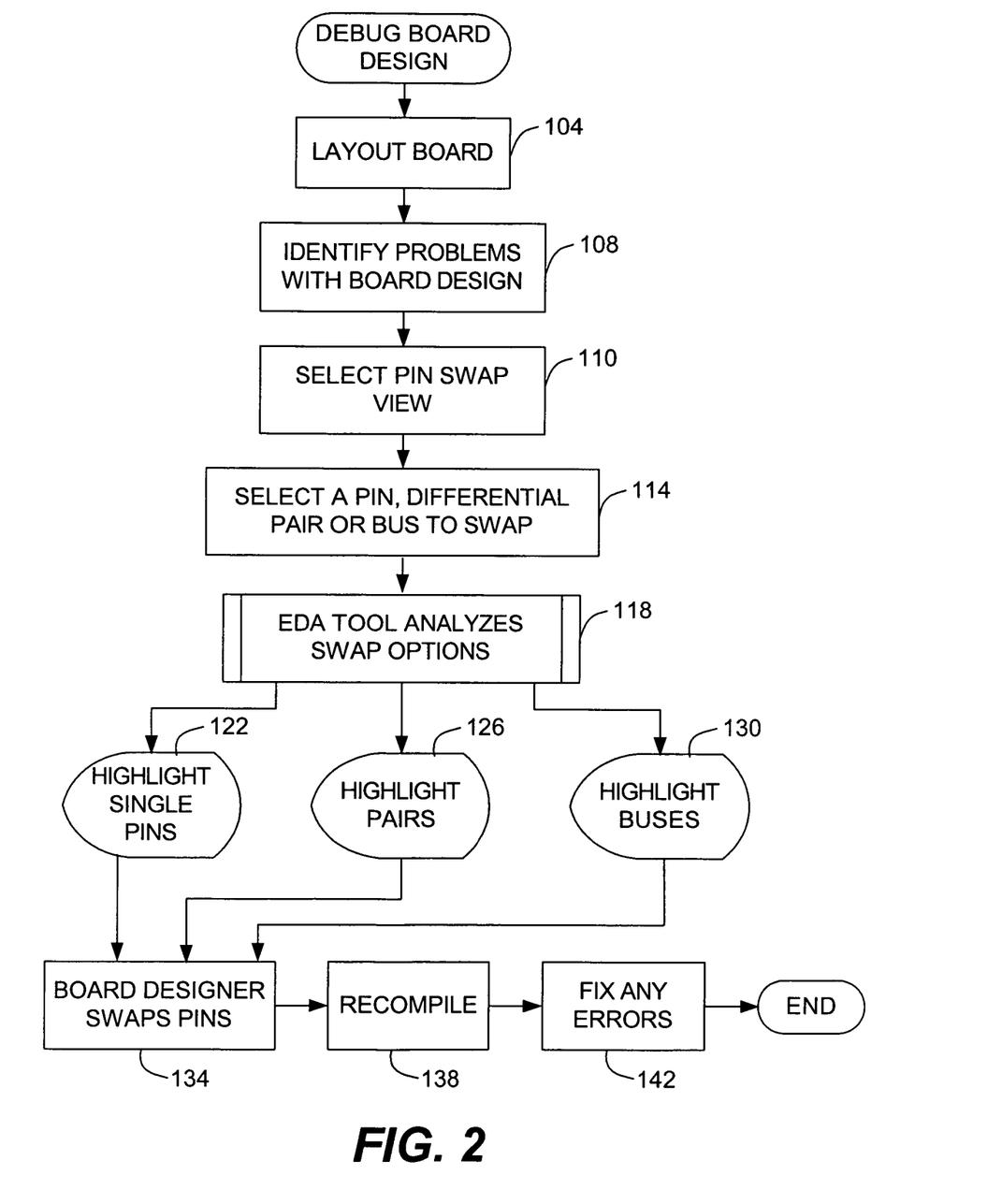
FIG. 2 is a flow diagram describing one embodiment by which a board designer uses the present invention to complete a design for a printed circuit board.

FIG. 2 is a flow diagram describing one embodiment by which a board designer uses the present invention to complete a design for a printed circuit board. In step 104 using EDA tool 32 board designer 30 designs a full layout 36 for a printed circuit board that will include the FPGA designed by the FPGA designer. EDA tool 32 also utilizes pin file 42 that was created in the compilation of the FPGA design. Compared to the board layout requirements 34 that were informal, preliminary constraints, layout 36 is a formal electronic design for the printed circuit board that may or may not have problems to be resolved.

As is the case with most electronic designs, in step 108 the board designer identifies any problems with the board design that need to be resolved. Although there may be a wide variety of issues to be considered, the description herein will focus on issues involving the FPGA and its design. EDA tool 32 is capable of identifying a wide variety of problems that might be associated with the FPGA such as: too many layers of the printed circuit board; traces crossing over one another; traces that cannot be routed; traces that are too long, leading to timing problems and signal integrity problems; etc. Through use of EDA tool 32 the board designer can identify specifically which pins of the FPGA and which traces on the printed circuit board are problematic.

To help resolve these problems, the board designer now turns to an embodiment of the present invention. In step 110 the board designer invokes a graphic utility of the EDA tool and selects a pin swap view 50 of the FPGA.

Figure 4:
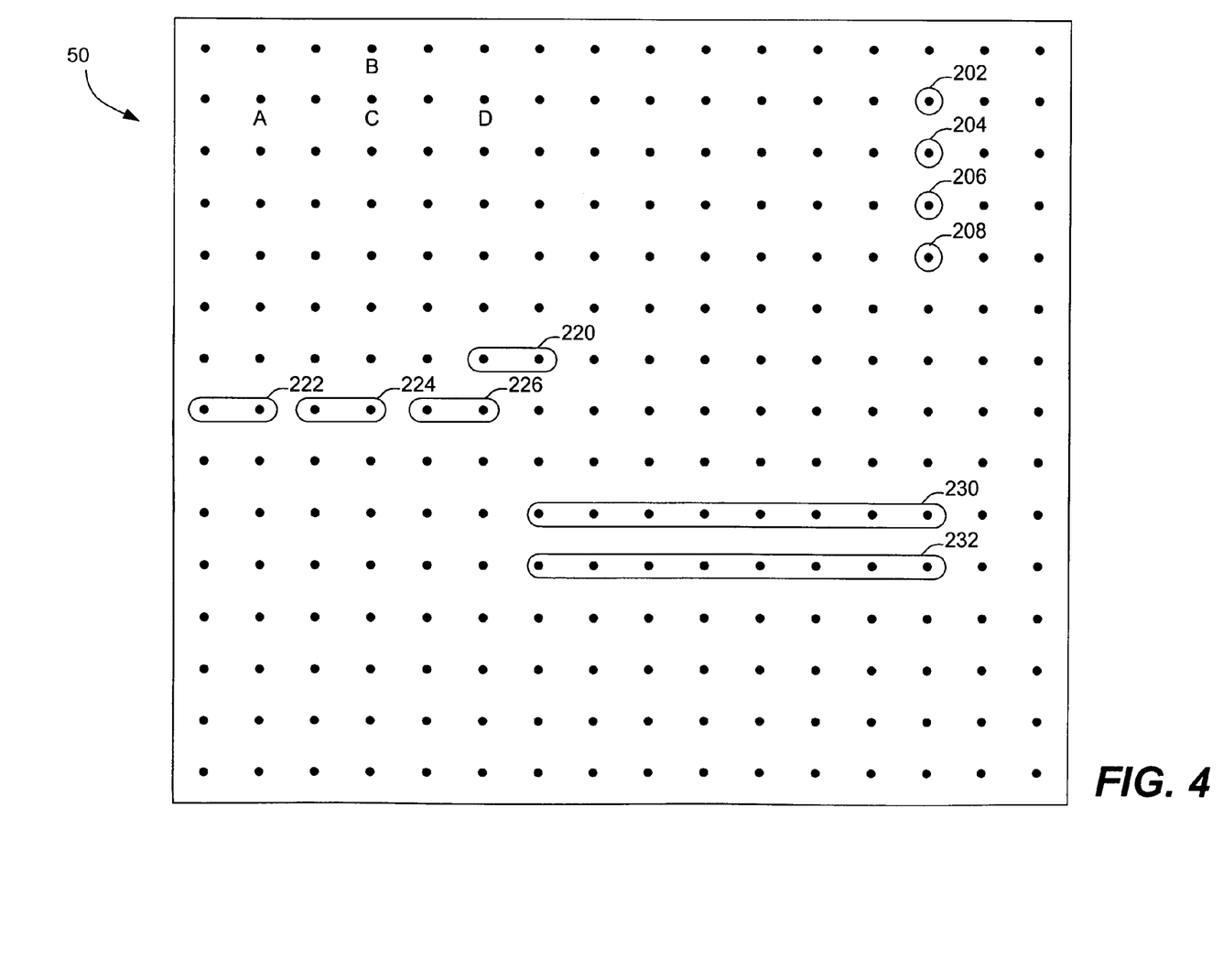
FIG. 4 illustrates one embodiment of a pin swap view presented in a graphic display on a computer screen.

FIG. 4 illustrates one embodiment of a pin swap view 50 presented in a graphic display on a computer screen. Pin swap view 50 graphically illustrates a bottom view of a Cyclone 240-pin FPGA available from Altera Corporation. Of course, any of a wide variety of other FPGAs or programmable logic devices can be illustrated in this form and analyzed using the present invention. The view shown is that if one were able to see through the FPGA by looking down upon it from above and see each individual solder ball contact. Other embodiments may show a different orientation of the bottom view of an FPGA, for example, by showing the bottom view when the device is flipped upside down. The view shown in FIG. 4 is preferred in that a board designer can more easily use this view to integrate the FPGA into the board design. Each individual dot in view 50 represents an individual solder ball contact (also referred to as a pin) of the FPGA. Each pin or contact is labeled with the I/O element associated with that pin, for example, shown are I/O element names A, B, C and D. Such labeling allows the board designer to quickly and easily identify which I/O element is associated with which pin in the current design. Not shown for ease of illustration are the other I/O element names for each of the remaining pins. In addition to the I/O element name for each pin, the physical pin or contact name may also be listed. The below description refers to "swapping pins" when in actuality it is the I/O elements of different pins that are being moved; the physical solder ball contacts are not being moved. The meaning will be clear from the context.

In step 114 the board designer makes a decision that a particular pin, differential pair or bus needs to be moved and makes the decision to attempt to swap that pin or pins with another pin or pins. The board designer is attempting to determine what are alternative locations for certain I/O elements or group of I/O elements on the FPGA. For example, a device placed close to one edge of the FPGA might have been moved to the opposite side in the course of the board design. The bus on the FPGA originally connected to that device might need to be moved. The board designer is now attempting to move that bus from one side of the FPGA to the other. The board designer now selects a particular pin (representing an I/O element), a differential pair, a bus, or any other suitable grouping of I/O elements on the FPGA. The selected pin or pins are then highlighted or noted in any suitable fashion in the graphic utility such that they are identified as the selected pin or pins. For example, a selected pin may be indicated in reverse video, may be enlarged, may have a circle placed around it, or may change to a particular color. It is also possible that the image of the selected pin or pins does not change in any manner.

The board designer selects a pin or pins by using a computer mouse, a tab key, an arrow key, a touch screen or any other suitable computer interface. In a specific embodiment, image 50 shows each I/O element and its name for a compiled FPGA design. A user selects a pin with the mouse, and then selected additional pin information may be displayed as a tool tip. Users may also zoom in and out of the image window. The designer may also simply enter an I/O element name or a physical pin name of the FPGA using text in a command line. The command line may accept as input an I/O element name or a pin name (or a pair or bus of such names) alone, or may also accept command line switches indicating that the user wishes to view only safe swaps, or risky swaps or both. The user may also indicate degrees of risk, such as slightly risky, very risky, dangerous, etc. that operate to output results based upon those indicated degrees of risk. In a specific embodiment, the Quartus II Tcl API implements the command line interface and is similar to other Quartus II report commands. In the example shown in image 50, a board designer has selected pin 202, differential pair 220 and bus 230 for a possible swap with other pin or pins.

In step 118 the EDA tool accepts the input from the board designer and performs an analysis of the possible swap options available. This step will be explained in greater detail below with reference to FIG. 4.

Once the EDA tool has analyzed the possible swap options for the pin or pins highlighted by the board designer, the tool then graphically presents the results of that analysis to the user in image 50 via steps 122, 126 or 130. The results of the swap analysis may be presented to the board designer in a wide variety of graphical or textual formats. For example, pins 204, 206 and 208 have been highlighted as possible swap options in step 122 in response to the board designer in selecting pin 202. These highlighted pins may be highlighted using color, motion, sound, graphical annotations, labeling, shape, types of borders, typeface, line size or intensity or other.

In one embodiment, pins are highlighted using color. For example, pin 204 turns green indicating that pin 204 may be successfully swapped with pin 202. In this embodiment, a green color indicates that the two pins have the same properties such as I/O standard, direction, current strength, etc. Also, it is preferred that pin 204, being a potential pin to be swapped, is already used in the current design. A green color indicates that no additional compilation is necessary to determine if the pin swap will be successful; the EDA tool more or less guarantees that no errors will result due to such a swap. In a specific embodiment, the color green indicates that this pin can be safely swapped within the operating conditions recommended by the FPGA vendor.

Potential pin 206 turns yellow indicating that while pin 206 might be swapped with pin 202 there is some risk involved. The yellow color indicates that a recompile must be performed before other swaps are contemplated to ensure that the swapping of pin 202 with pin 206 will be successful. Various reasons may exist why such a swap is risky: the pin to be swapped with might be currently unused, and the use of such a pin might be detrimental to the design; the designer might be trying to swap an input with an output; the I/O standards of the two pins are not the same but merely similar; and simultaneous switching noise is a possibility. Because one or more of these risks might be present, it is recommended that a recompile be performed. It is also contemplated that a yellow color merely necessitates that warning messages be provided to the board engineer and that a recompile is not strictly necessary. In a specific embodiment, the color yellow indicates that swapping this pin is outside of the operating conditions recommended by the FPGA vendor.

Potential pin 208 turns red indicating that pin 208 may not be swapped with pin 202. Two pins may not be swapped because, for example, they use different I/O standards, one is part of a differential pair, one is a dedicated configuration pin, or one of the pins is power or ground. There may also be a variety of other reasons why two pins may not be swapped.

In step 126 differential pairs 222, 224 and 226 are highlighted response to the board designer selecting differential pair 220. Pair 226 is highlighted in green indicating that it may be swapped with pair 220; pair 224 is highlighted in yellow indicating that there are risks in swapping with pair 220; and pair 222 is highlighted in red indicating that this pair may not be swapped with pair 220. When three pairs such as 222, 224 and 226 are contiguous, it is also preferred that the graphic utility provides any means of delineation of the pairs (such as by a circle or oval around each pair) so that it is clear which are the relevant pairs.

In step 130 bus 232 is highlighted in response to the board designer selecting bus 230. Bus 232 may be highlighted in green, yellow or red depending upon its suitability for being swapped with bus 230. Of course, different techniques may be used for highlighting pins, pairs or buses. Alternatively, in addition to or in place of the highlighting presented on image 50, the EDA tool may present the results of its analysis via simple text. For example, the tool may simply list in textual form the names or numbers of which pins are suitable for swapping and a corresponding color or text description of whether the swap is acceptable, risky or not permitted.

In step 134 the board designer now has the option to swap the pin or pins highlighted in the graphic utility. Using the graphic utility of the EDA tool the board designer indicates in any suitable fashion (i.e., using a graphical user interface, text input, etc.) that a pin or pins should be swapped. For example, the designer indicates that pins 202 and 204 should be swapped, that differential pair 220 should be swapped with pair 226, or that bus 230 should be swapped with bus 232. Of course, the FPGA designer may also direct the software to perform the swap, although for efficiency it is often desirable that the board designer make the swap as he or she has the capability within the EDA tool to do the swap immediately.

In step 138 the board designer uses the EDA tool to execute a recompile of the FPGA to double check that the swap performed did not have any adverse effects. For example, the board designer looks in the resulting report file to check to make sure that all timing constraints are still satisfied. In addition, a recompile of the board layout design is performed as well.

In step 142 any errors flagged during the recompile are fixed by the board designer or the FPGA designer. The board designer may now iterate through the process again beginning at step 104, identifying potential problems in the board design and swapping pins on the FPGA if necessary. The present invention thus speeds up the iterative process of integrating an FPGA design into a board layout, allowing the iterative process to occur much faster.

Figure 3:
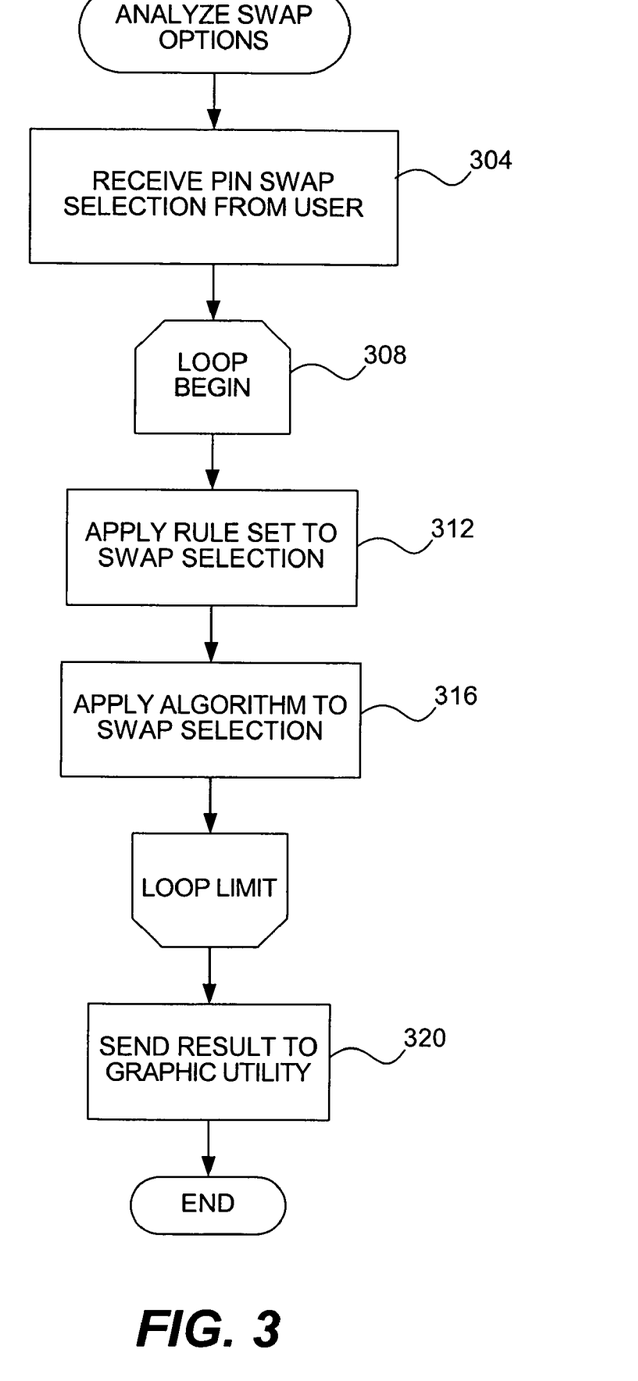
FIG. 3 is a flow diagram describing in greater detail how an EDA tool analyzes potential pin swap options of an FPGA.

FIG. 3 is a flow diagram describing in greater detail how an EDA tool analyzes potential pin swap options of an FPGA. FIG. 3 explains in greater detail step 118 from FIG. 2. In step 304 the potential pin swap selection from the user is received by the EDA software tool. For example, the software recognizes that the user wishes to swap pin 204 with pin 202. Step 308 begins a loop that iterates over all rule sets, algorithms and other constraints that the software will apply to the proposed pin swap.

The present invention recognizes that while all of the necessary rule sets, algorithms and constraints are built into an EDA tool that performs compilation of an FPGA design (such as Quartus II from Altera Corporation), these constraints are not readily accessible to a user such as a board designer. Because various rules are checked at different times during a compilation these rules may be stored in different areas accessed by the software tool and are not necessarily available to a board designer, and have not been available in an easy-to-use graphical interface. By providing software that automates the checking of these constraints for a potential swap pair, and then presenting the results in a graphical interface, the design of a board including an FPGA is made much easier.

Step 312 applies a rule set to the proposed swap selection; such a rule set may be a single rule or a grouping of related rules. By way of example, a rule may be one of the following: check that the proposed I/O standard is supported by an I/O element; check that two incompatible I/O elements are not next to one another; check for cross talk; check for simultaneous switching; check for potential device migration problems (e.g., from one device to a larger or smaller one in the same family or from the FPGA to a structured ASIC); etc.

Step 316 applies a constraint algorithm to the proposed swap selection. Any of a wide variety of algorithms necessary to ensure the legality of a pin swap may be applied to the proposed pin swap selection. By way of example, such an algorithm checks whether the power consumption from certain types of I/Os would require better power protection, checks whether different bus structures would need consideration for simultaneous switching noise, or checks for timing violations and power consumption for the I/O elements.

Loop 308 iterates over all applicable rule sets and algorithms until done. Next, in step 320 the result is forwarded to the graphic utility to be presented to the user as described in steps 122, 126 and 130.

Computer System Embodiment

Figure 5A:
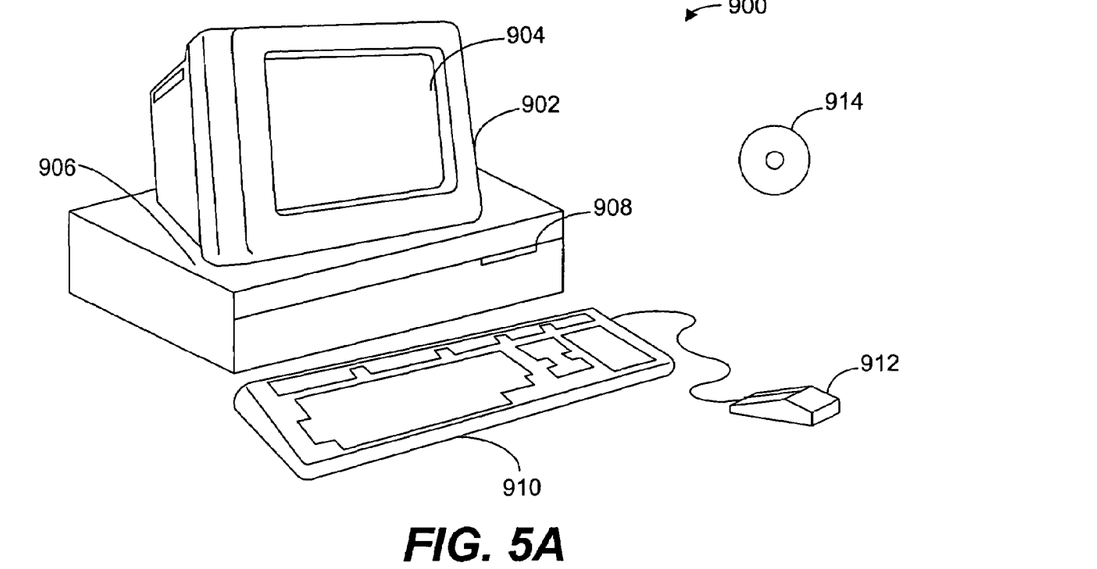
FIGS. 5A and 5B illustrate a computer system suitable for implementing embodiments of the present invention.
Figure 5B:
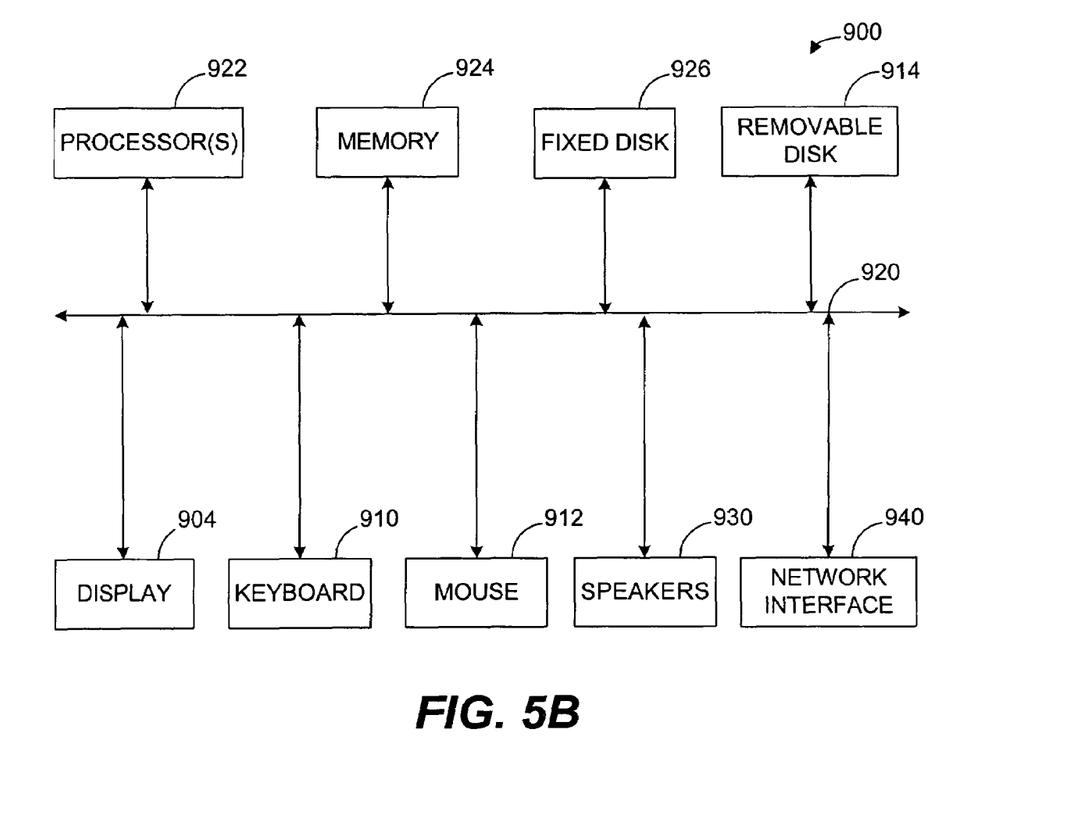

FIGS. 5A and 5B illustrate a computer system 900 suitable for implementing embodiments of the present invention. FIG. 5A shows one possible physical form of the computer system. Of course, the computer system may have many physical forms ranging from an integrated circuit, a printed circuit board or a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 5B is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A method of laying out an electronic board design that includes a programmable logic device (PLD), said method comprising:
   presenting a graphical image to a user that shows physical pin locations of said PLD, each of said pin locations including a name identifying an I/O element associated with that pin location;
   receiving a selection from said user indicating one of said names;
   applying a plurality of constraints by taking into account said selected name and other I/O elements of said PLD to identify at least one of said other I/O elements as being compatible with said selected name; and
   outputting an identification of said at least one of said other identified I/O elements to said user, whereby said user can swap the I/O element associated with said selected name with said at least one of said other identified I/O elements.

2. A method as recited in claim 1 wherein receiving a selection from said user includes receiving the selection through a user interaction with said graphical image, and wherein said step of outputting an identification includes highlighting in graphical form the pin location associated with said at least one of said other identified I/O elements.

3. A method as recited in claim 1 wherein receiving a selection from said user includes receiving the selection through user textual input, and wherein said step of outputting an identification includes identifying said at least one of said other identified I/O elements by textual output.

4. A method as recited in claim 1 wherein said constraints are rule sets and algorithms associated with the I/O elements of said PLD.

5. A method as recited in claim 1 wherein said PLD is a programmable array logic (PAL), a field programmable gate array (FPGA), or complex programmable logic device (CPLD).

6. A method as recited in claim 1 wherein said PLD is embodied in a flip-chip package or as a wire-bonded package.

7. A method as recited in claim 1 further comprising:
   accepting a swap direction from said user indicating to swap the I/O element associated with said selected name with said at least one of said other identified I/O elements;
   swapping the I/O element associated with said selected name with said at least one of said other identified I/O elements, whereby the design of said PLD is modified.

8. A method as recited in claim 7 further comprising:
   recompiling the design of said PLD.

9. A method of laying out an electronic board design that includes a programmable logic device (PLD), said method comprising:
   presenting a graphical image to a user that shows physical pin locations of said PLD, each of said pin locations including a name identifying an I/O element associated with that pin location;
   receiving a selection from said user indicating a differential pair of said pin locations;
   applying a plurality of constraints by taking into account said selected differential pair and other differential pairs of said PLD to identify at least one of said other differential pairs as being compatible with said selected differential pair; and
   outputting an identification of said identified differential pair to said user, whereby said user can swap the I/O elements associated with said selected differential pair with the I/O elements of said identified differential pair.

10. A method is recited in claim 9 wherein receiving a selection from said user includes receiving the selection through user interaction with said graphical image, and wherein outputting an identification includes highlighting in graphical form the pin locations associated with said identified differential pair.

11. A method as recited in claim 9 wherein receiving a selection from said user includes receiving the selection through user textual input, and wherein said step of outputting an identification includes identifying said differential pair by textual output.

12. A method as recited in claim 9 wherein said constraints are rule sets and algorithms associated with the I/O elements of said PLD.

13. A method as recited in claim 9 wherein said PLD is a programmable array logic (PAL), a field programmable gate array (FPGA), or complex programmable logic device (CPLD).

14. A method as recited in claim 9 wherein said PLD is embodied in a flip-chip package or as a wire-bonded package.

15. A method as recited in claim 9 further comprising:
   accepting a swap direction from said user to swap the I/O elements associated with said selected differential pair with the I/O elements of said identified differential pair;
   swapping the I/O elements associated with said selected differential pair with the I/O elements of said identified differential pair, whereby the design of said PLD is modified.

16. A method as recited in claim 15 further comprising:
   recompiling the design of said PLD.

17. A method of laying out an electronic board design that includes a programmable logic device (PLD), said method comprising:
   presenting a graphical image to a user that shows physical pin locations of said PLD, each of said pin locations including a name identifying an I/O element associated with that pin location;
   receiving a selection from said user indicating pin locations including a bus of said PLD;
   applying a plurality of constraints by taking into account said selected bus and other buses of said PLD to identify one of said other buses as being compatible with said selected bus; and outputting an identification of said identified bus to said user, whereby said user can swap the I/O elements associated with said selected bus with the I/O elements of said identified bus.

18. A method is recited in claim 17 wherein receiving a selection from said user includes receiving the selection via user interaction with said graphical image, and wherein outputting an identification includes highlighting in graphical form the pin locations associated with said identified bus.

19. A method as recited in claim 17 wherein receiving a selection from said user includes receiving the selection via user textual input, and wherein outputting an identification includes identifying said identified bus by textual output.

20. A method as recited in claim 17 wherein said constraints are rule sets and algorithms associated with the I/O elements of said PLD.

21. A method as recited in claim 17 wherein said PLD is a programmable array logic (PAL), a field programmable gate array (FPGA), or complex programmable logic device (CPLD).

22. A method as recited in claim 17 wherein said PLD is embodied in a flip-chip package or as a wire-bonded package.

23. A method as recited in claim 17 further comprising:
accepting a swap direction from said user to swap the I/O elements associated with the selected bus with the I/O elements of the identified bus;

swapping the I/O elements associated with said selected bus with the I/O elements of said identified bus, whereby the design of said PLD is modified.

24. A method as recited in claim 23 further comprising:
recompiling the design of said PLD.

25. A computer-readable medium having stored thereon computer code comprising sequences of instructions for laying out an electronic board design that includes a programmable logic device (PLD), said computer code including instructions which, when executed by a processor, causes the processor to perform:

presenting a graphical image to a user that shows physical pin locations of said PLD, each of said pin locations including a name identifying an I/O element associated with that pin location;

receiving a selection from said user indicating one of said names;

applying a plurality of constraints by taking into account said selected name and other I/O elements of said PLD to identify at least one of said other I/O elements as being compatible with said selected name; and outputting an identification of said at least one of said other identified I/O elements to said user, whereby said user can swap the I/O element associated with said selected name with said at least one of said other identified I/O elements.

* * * * *